United States Patent
Akhter et al.

(10) Patent No.: US 9,215,296 B1
(45) Date of Patent: Dec. 15, 2015

(54) METHOD AND APPARATUS FOR EFFICIENT RADIO UNIT PROCESSING IN A COMMUNICATION SYSTEM

(75) Inventors: Mohammad Shahanshah Akhter, Ottawa, CA (US); Brian Scott Darnell, Suwanee, GA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 479 days.

(21) Appl. No.: 13/609,195

(22) Filed: Sep. 10, 2012

Related U.S. Application Data

(60) Provisional application No. 61/642,424, filed on May 3, 2012, provisional application No. 61/642,322, filed on May 3, 2012.

(51) Int. Cl.
*H04L 29/06* (2006.01)

(52) U.S. Cl.
CPC .................................. *H04L 69/04* (2013.01)

(58) Field of Classification Search
None
See application file for complete search history.

(56) References Cited

U.S. PATENT DOCUMENTS

| | | | |
|---|---|---|---|
| 5,999,561 A | 12/1999 | Naden et al. | |
| 6,192,259 B1 | 2/2001 | Hayashi | |
| 6,226,325 B1 | 5/2001 | Nakamura | |
| 6,263,503 B1 | 7/2001 | Margulis | |
| 6,449,596 B1 | 9/2002 | Ejima | |
| 6,728,778 B1 * | 4/2004 | Brennan et al. | 709/238 |
| 6,775,530 B2 | 8/2004 | Severson et al. | |
| 6,842,623 B2 | 1/2005 | Koscal | |
| 6,903,668 B1 | 6/2005 | Drorr et al. | |
| 7,009,533 B1 | 3/2006 | Wegener | |
| 7,088,276 B1 | 8/2006 | Wegener | |
| 7,142,519 B2 | 11/2006 | Saadeh et al. | |
| 7,541,950 B2 | 6/2009 | Wegener | |

(Continued)

FOREIGN PATENT DOCUMENTS

| | | |
|---|---|---|
| KR | 20080056360 | 6/2008 |
| WO | 2005062494 | 7/2005 |

(Continued)

OTHER PUBLICATIONS

CPRI Specification V3.0 Common Public Radio Interface (CPRI); Interface Specification, Oct. 2, 2006, 89 pages, Ericsson Ab, huawei Technologies Col Ltd, NEC Corporation, Nortel Networks SA and Siemens networks BmbH & Co. KG.

(Continued)

*Primary Examiner* — Gregory Sefcheck
*Assistant Examiner* — Jenkey Van
(74) *Attorney, Agent, or Firm* — Glass & Associates; Kenneth Glass

(57) ABSTRACT

The method and apparatus of the present invention provides for reduced power consumption and cost while supporting wide bandwidth signals from a large number of antennas, as is required by next generation systems. In accordance with the present invention, a method and apparatus are provided for processing data in a radio unit of a communication system by receiving compressed data at one or more interfaces or internal resources of a distributed switch of a radio unit, operating the distributed switch to match the interface bandwidth to the resource bandwidth and distributing the compressed data received at the one or more interfaces or internal resources to the one or more internal resources or interfaces of the radio unit through the distributed switch.

24 Claims, 10 Drawing Sheets

(56) References Cited

U.S. PATENT DOCUMENTS

| | | | |
|---|---|---|---|
| 7,623,894 | B2 | 11/2009 | Vaglica et al. |
| 7,656,897 | B2 | 2/2010 | Liu |
| 7,680,149 | B2 | 3/2010 | Liu et al. |
| 7,706,477 | B2 | 4/2010 | Larsson |
| 7,835,435 | B2 | 11/2010 | Soni et al. |
| 7,852,797 | B2 | 12/2010 | Kang et al. |
| 7,899,410 | B2 | 3/2011 | Rakshani et al. |
| 7,924,929 | B2 | 4/2011 | Meenakshisundaram et al. |
| 7,961,807 | B2 | 6/2011 | Kotecha et al. |
| 8,005,152 | B2 | 8/2011 | Wegener |
| 8,018,910 | B2 | 9/2011 | Jiang |
| 8,054,889 | B2 | 11/2011 | Isu et al. |
| 8,089,854 | B2 | 1/2012 | Persico |
| 8,165,100 | B2 | 4/2012 | Sabat et al. |
| 8,174,428 | B2 | 5/2012 | Wegener |
| 8,176,524 | B2 | 5/2012 | Singh et al. |
| 8,239,912 | B2 | 8/2012 | Deng |
| 8,340,021 | B2 | 12/2012 | Okeeffe et al. |
| 2002/0055371 | A1 | 5/2002 | Arnon et al. |
| 2003/0100286 | A1 | 5/2003 | Severson et al. |
| 2004/0004943 | A1 | 1/2004 | Kim |
| 2004/0062392 | A1 | 4/2004 | Morton |
| 2004/0082365 | A1 | 4/2004 | Sabach et al. |
| 2004/0198237 | A1 | 10/2004 | Abutaleb et al. |
| 2005/0104753 | A1 | 5/2005 | Dror et al. |
| 2005/0105552 | A1 | 5/2005 | Osterling |
| 2005/0134907 | A1* | 6/2005 | Obuchi et al. ............... 358/1.15 |
| 2005/0169411 | A1 | 8/2005 | Kroeger |
| 2006/0159070 | A1 | 7/2006 | Deng |
| 2007/0054621 | A1 | 3/2007 | Larsson |
| 2007/0070919 | A1* | 3/2007 | Tanaka et al. ............... 370/254 |
| 2007/0076783 | A1 | 4/2007 | Dishman et al. |
| 2007/0116046 | A1* | 5/2007 | Liu et al. .................... 370/466 |
| 2007/0149135 | A1 | 6/2007 | Larsson et al. |
| 2007/0160012 | A1* | 7/2007 | Liu .............................. 370/334 |
| 2007/0171866 | A1 | 7/2007 | Merz et al. |
| 2008/0018502 | A1 | 1/2008 | Wegener |
| 2008/0022026 | A1* | 1/2008 | Yang et al. .................. 710/200 |
| 2009/0092117 | A1 | 4/2009 | Jiang |
| 2009/0149221 | A1 | 6/2009 | Liu et al. |
| 2009/0265744 | A1 | 10/2009 | Singh et al. |
| 2009/0290632 | A1* | 11/2009 | Wegener ....................... 375/240 |
| 2010/0067366 | A1 | 3/2010 | Nicoli |
| 2010/0177690 | A1 | 7/2010 | Okeeffe et al. |
| 2010/0202311 | A1 | 8/2010 | Lunttila et al. |
| 2010/0246642 | A1 | 9/2010 | Walton et al. |
| 2010/0285756 | A1 | 11/2010 | Nakazawa |
| 2011/0280209 | A1 | 11/2011 | Wegener |
| 2012/0008696 | A1 | 1/2012 | Wegener |
| 2012/0014421 | A1 | 1/2012 | Wegener |
| 2012/0014422 | A1 | 1/2012 | Wegener |
| 2012/0057572 | A1 | 3/2012 | Evans |
| 2012/0183023 | A1 | 7/2012 | Filipovic et al. |
| 2012/0202507 | A1 | 8/2012 | Zhang et al. |
| 2012/0250740 | A1* | 10/2012 | Ling ............................ 375/219 |
| 2012/0328121 | A1 | 12/2012 | Truman et al. |

FOREIGN PATENT DOCUMENTS

| | | |
|---|---|---|
| WO | 2008152455 | 12/2008 |
| WO | 2009143176 | 11/2009 |
| WO | 2009/151893 | 12/2009 |
| WO | 2009151893 | 12/2009 |
| WO | 2011/135013 | 6/2011 |

OTHER PUBLICATIONS

OBSAI Open Base Station Architecture Initiative Reference Point 3 Specification Ver. 4.0, Mar. 7, 2007, 119 pages.

OBSAI Open base Station Architecture Initiative BTS System Reference document Ver. 2.0, Apr. 27, 2006, 151 pages.

Maruyama, S. et al., "Base Transceiver Station for W-CDMA System," Fujitsu Sci. Tech. J. 38,2, p. 167-73, Dec. 2002.

K. I. Penderson. "Frequency domain scheduling for OFMA with limited and noisy channel feedback" 2007 IEEE 66th Vehicular Technology Conference. pp. 1792-1796, Oct. 3, 2007., see section II. C.

CPRI Specification V4.1, Commmon Public Interface (CPRI); Interface Specification, Feb. 1, 2009, 75 pages.

\* cited by examiner

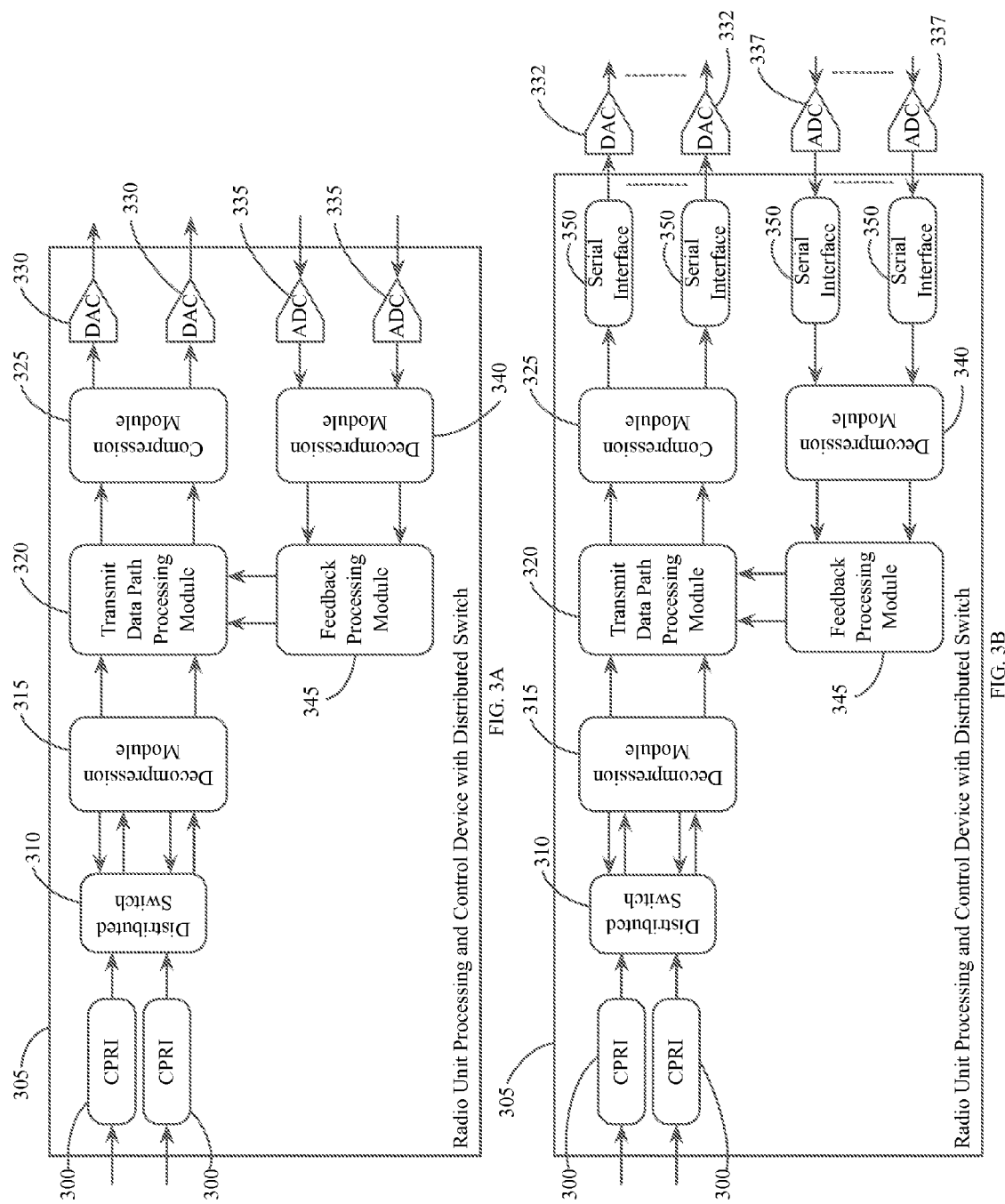

METHOD AND APPARATUS FOR EFFICIENT RADIO UNIT PROCESSING IN A COMMUNICATION SYSTEM

CROSS-REFERENCE TO RELATED APPLICATIONS

This application claims priority to U.S. Provisional Patent Application No. 61/642,424 filed on May 3, 2012 entitled, "Method and Apparatus for Efficient Radio Processing in Communication Systems" and U.S. Provisional Patent Application No. 61/642,322 filed on May 3, 2012 entitled, "Efficient Signal Chain Processing for Communication Systems," each of which are incorporated by reference in their entirety. This application is related to the patent application titled "Method and Apparatus for efficient Baseband Unit Processing in a Communication System," by Mohammad Shahanshah Akhter and Brian Scott Darnell, filed on even date herewith, that is hereby incorporated by reference in its entirety.

BACKGROUND OF THE INVENTION

Transceiver systems in wireless communication networks perform the control functions for directing signals among communicating subscribers, or terminals, as well as communication with external networks. The general operations of a radio transceiver system include receiving radio frequency (RF) signals, converting them to signal data, performing various control and signal processing operations on the signal data, converting the signal data to an RF signal and transmitting the RF signal to the wireless subscriber. Transceiver systems in wireless communications networks include radio base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A terminal may be fixed or mobile wireless user equipment unit (UE) and may be a wireless device, cellular phone, personal digital assistant (PDA), personal computer or other device equipped with a wireless modem.

The rapid increase in data (e.g., video) communication and content consumption has led to expansion of wireless communication networks. As a result, the introduction of next generation communication standards (e.g., 3GPP LTE-A, IEEE 802.16m) has led to improved techniques for data processing, such as carrier aggregation (e.g., 100 MHz) with 8×8 MIMO (Multiple-Input, Multiple-Output) and CoMP (Cooperative Multi-Point). This in turn has created the need for radio access networks capable of handling wider bandwidths and an increasing number of antennas. These radio access networks will require a higher numbers of fiber links to connect the base stations to the remote radio units. In addition, it is desirable to provide carrier aggregation with Multiple-Input and Multiple-Output (MIMO) and Co-operative Multipoint (CoMP) techniques to significantly increase spectral efficiency. The implementation of Co-Operative Multi-point techniques requires communication between baseband units and enables load balancing for the communication system.

Modern communication systems require an increasing number of optical or copper ports and links between the baseband units and the radio units to support the various protocols and they often require a large number of discrete devices and signal routing traces to support the improved architectures. However, the improved architectures may not scale due to input and output bottlenecks. The large number of discrete devices and signal routing may also increase the cost of the device. Additionally, innovative device architectures will be required to support the increased clock frequency operation and the larger number of processing functions to efficiently process uplink, feedback and downlink data in addition to the required control signals. To support remote monitoring, debugging, control and management, such devices will also need to support a large amount of data storage.

Accordingly, there is a need for a method and apparatus that will allow for an increasing number of antennas at the radio unit as well as implementation of MIMO, CoMP and load balancing, while reducing power consumption and cost of the device. Also, there is a need for a method and apparatus that will provide these features while reducing the number of discrete devices.

SUMMARY OF THE INVENTION

The present invention provides a method and apparatus that will allow for an increasing number of antennas at the radio unit as well as implementation of MIMO, CoMP and load balancing, while reducing power consumption and cost of the device. Also, there is a need for a method and apparatus that will provide these features while reducing the number of discrete devices.

The method and apparatus of the present invention provides for reduced power consumption and cost while supporting wide bandwidth signals from a large number of antennas, as is required by next generation systems.

In operation, a method for processing data in a radio unit of a communication system in accordance with the present invention may include, receiving compressed data at one or more interfaces of a distributed switch of a first radio unit, the received data to be transmitted to one or more internal resources of the first radio unit, wherein each of the interfaces has an associated interface bandwidth and each of the internal resources has an associated resource bandwidth, operating the distributed switch to match the interface bandwidth of the one or more interfaces to the resource bandwidth of the one or more internal resources and distributing the data received at the one or more interfaces to the one or more internal resources of the first radio unit through the distributed switch.

If the received data is decompressed data, the method may further include compressing the data prior to distributing the data received at the one or more interfaces to the one or more internal resources of the first radio unit through the distributed switch and decompressing the received data after distributing the data through the distributed switch.

In an additional embodiment, a method for processing data in a radio unit of a communication system in accordance with the present invention may include, receiving compressed data at one or more internal resources of a distributed switch of a first radio unit, the received data to be transmitted to one or more interfaces of the first radio unit, wherein each of the internal resources has an associated resource bandwidth and each the interfaces has an associated interface bandwidth, operating the distributed switch to match the resource bandwidth of the one or more internal resources to the interface bandwidth of the one or more interfaces and distributing the data received at the one or more internal resources to the one or more interfaces of the first radio unit through the distributed switch.

If the received data is decompressed data, the method may further include compressing the data prior to distributing the data received at the one or more internal resources to the one or more internal resources of the first radio unit through the distributed switch and decompressing the received data after distributing the data through the distributed switch.

An apparatus in accordance with the present invention may include, a radio unit processing and control unit having a distributed switch, the distributed switch further configured to receive compressed data at one or more interfaces of the distributed switch, the received data to be transmitted to one or more internal resources of the radio unit, wherein each of the interfaces has an associated interface bandwidth and each the internal resources has an associated resource bandwidth, match the interface bandwidth of the one or more interfaces to the resource bandwidth of the one or more internal resources and distribute the data received at the one or more interfaces to the one or more internal resources of the radio unit.

In an additional embodiment, an apparatus for processing data in a radio unit of a communication system in accordance with the present invention may include, a radio unit processing and control unit having a distributed switch, the distributed switch further configured to receive compressed data at one or more internal resources of the distributed switch of the radio unit, the received data to be transmitted to one or more interfaces of the radio unit, wherein each of the internal resources has an associated resource bandwidth and each of the interfaces has an associated interface bandwidth, match the resource bandwidth of the one or more internal resources to the interface bandwidth of the one or more interfaces and distribute the data received at the one or more internal resources to the one or more interfaces of the radio unit.

BRIEF DESCRIPTION OF DRAWINGS

FIG. 3A is a block diagram illustrating a radio unit processing and control device having a distributed switch operating in a downlink mode having integrated converters in accordance with the present invention.

FIG. 3B is a block diagram illustrating a radio unit processing and control device having a distributed switch operating in a downlink mode having non-integrated converters in accordance with the present invention.

DESCRIPTION OF THE INVENTION

Figure 1A:
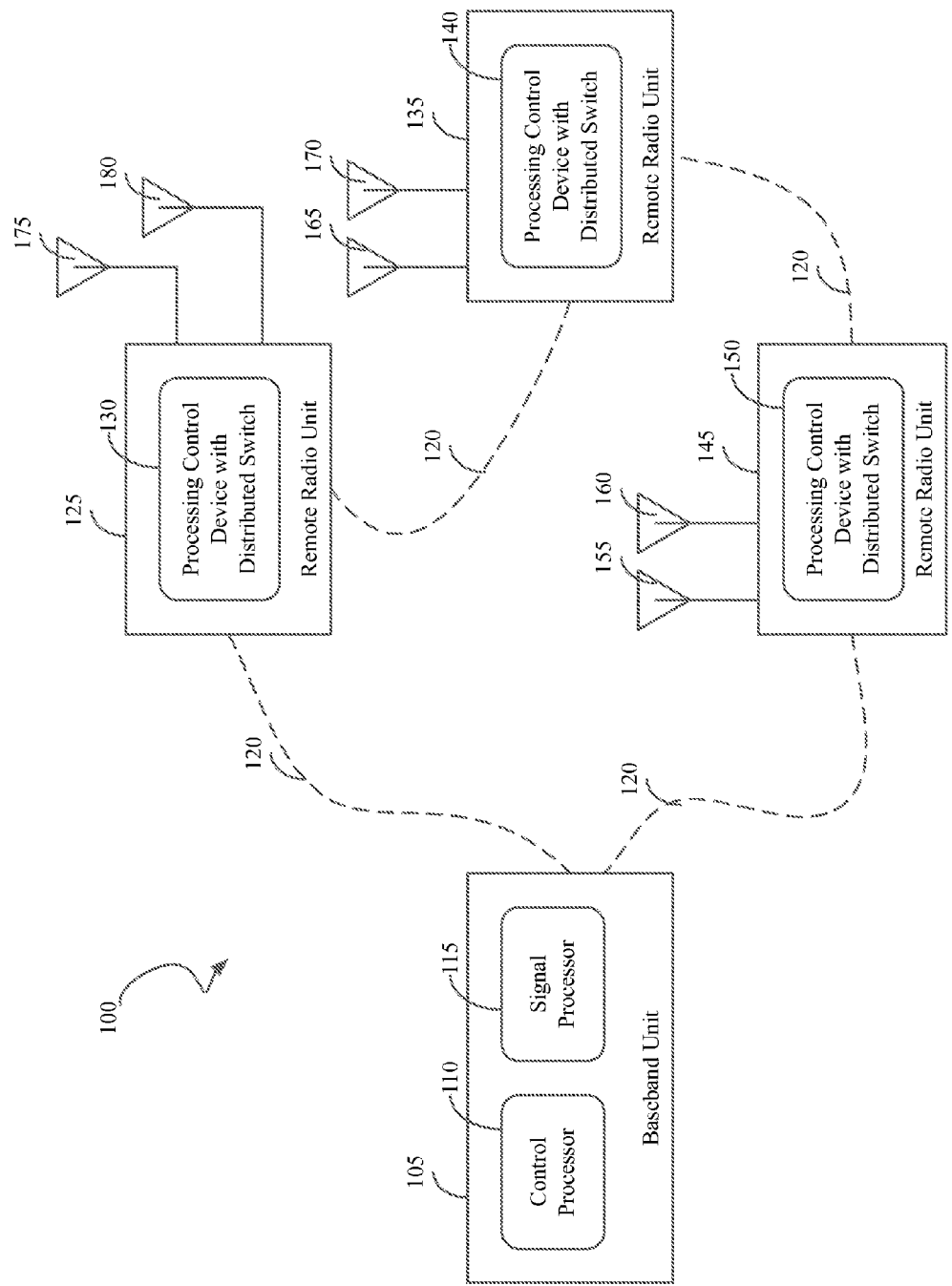
FIG. 1A is an illustration of a ring topology communication system in accordance with an embodiment of the present invention.

The modular design approach for radio transceiver systems, wherein the baseband processing is separated from the radio frequency processing, has led the industry to develop interface standards. One example of a standard interface for the data transfer interfaces between the radio units and baseband units of transceiver systems is the Common Public Radio Interface (CPRI). Connection topologies between the baseband unit and one or more remote radio units include point-to-point, multiple point-to-point, chain, star, tree, ring and combinations thereof. Another example of an interface specification for modular architecture of radio transceiver systems is the Open Base Station Architecture Initiative (OB-SAI). The OBSAI specification describes alternative protocols for the interconnection of and baseband modules and remote radio units analogous to the CPRI specification, as well as data transfer protocols for the serial data links.

In conventional cellular communication systems, radio coverage is provided for a given geographic area via multiple base stations distributed throughout the geographic area involved. In this way, each base station can serve traffic in a smaller geographic area. Consequently, multiple base stations in a wireless communication network can simultaneously serve users in different geographic areas, which increases the overall capacity of the wireless network involved.

In order to further increase the capacity of wireless systems, each base station may be configured to support radio coverage in multiple sectors. For example, a base station in a conventional cellular system may be configured to provide radio coverage in one sector, three sectors or six sectors. In those systems employing multiple sectors per base station, each sector can handle part of the traffic in an additional smaller geographic area, which increases the overall capacity of the wireless network involved. Each of the sectors may include multiple remote radio units in communication with each of the base stations. Each of the radio units may further include multiple antennas for both receiving and transmitting data between the radio unit and the user of the communication system.

As described, communication systems are known in the art to include a baseband unit for performing signal processing in communication with a remote radio unit for receiving and transmitting signals to an antenna. The present invention provides a method and apparatus for an efficient processing solution implemented in the radio unit of a communication system.

While the various embodiments are illustrated utilizing a CPRI link, this is not meant to be limiting and it is within the scope of the present invention to substitute an S-RIO or Ethernet link for the illustrated CPRI link in the various embodiments of the present invention. In addition, while the various embodiments are shown to employ a remote radio unit, it is additionally within the scope of the present invention for the radio unit to be incorporated with the baseband unit and therefore not located remotely from the baseband unit.

Figure 1B:
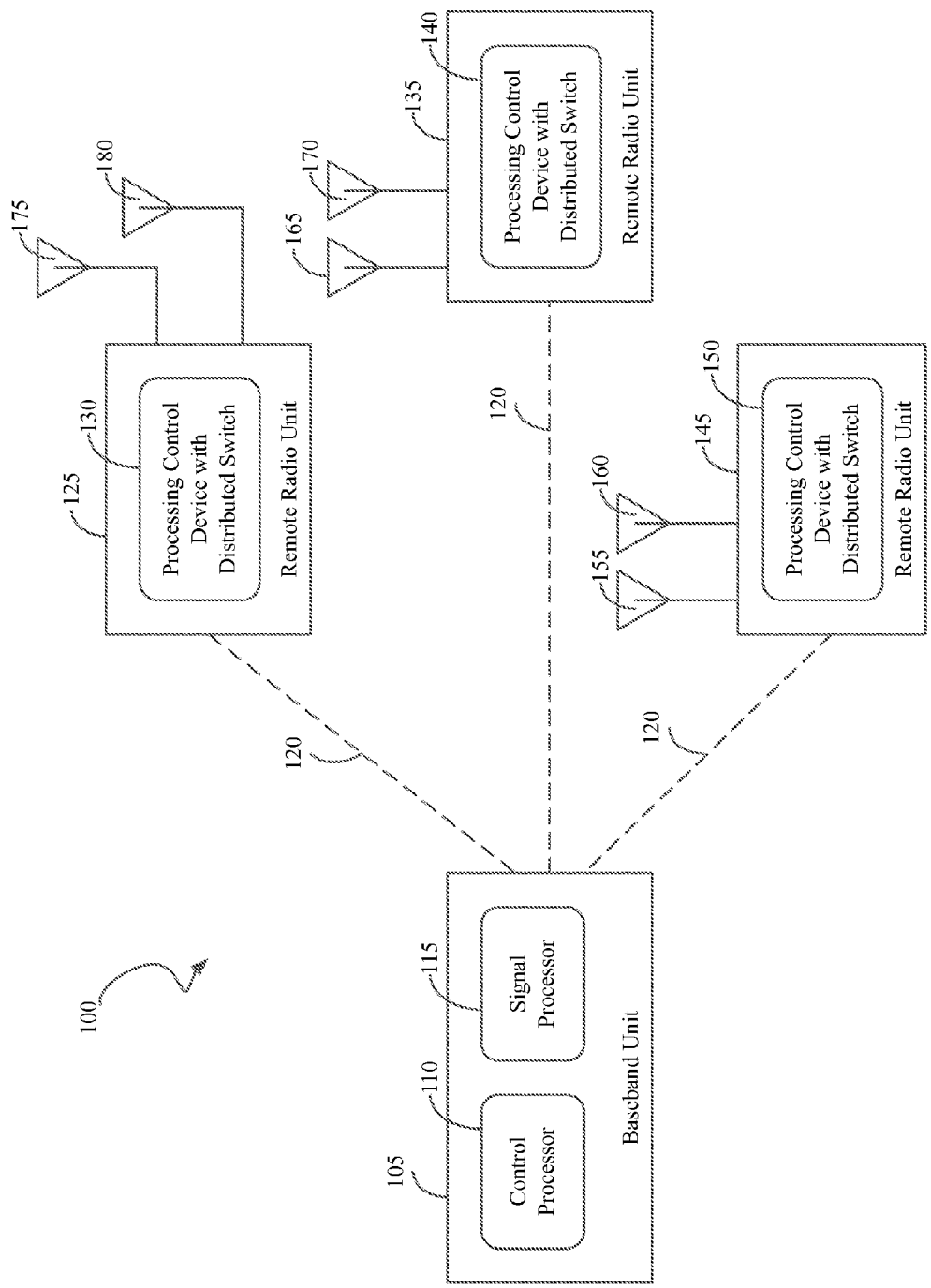
FIG. 1B is an illustration of a star topology communication system in accordance with an embodiment of the present invention.

With reference to FIG. 1A and FIG. 1B, in a communication system 100, remote radio units 125, 135, 145 may include one or more antenna 155, 160, 165, 170, 175, 180 that may be used to transmit radio frequency data to a user or to receive radio frequency data from a user. The remote radio units 125, 135, 145 may be coupled to a baseband unit 105 and to each other through either a wired or wireless connection 120. In a particular embodiment, the connection may be a wired CPRI link. The baseband unit 105 may include a control processor 110 and a signal processor 115. In the present invention, each of the remote radio units 125, 135, 145 may include a processing control device having a distributed switch 130, 140, 150. The processing control device may include a plurality of processing resources. The radio units 125, 135, 145 may be operating in the same sector or in different sectors. In operation, the radio units 125, 135, 145 may receive data from the baseband unit 105, from one or more of the antenna 155, 160, 165, 170, 175, 180, or from another one of the radio units 125, 135, 145 at an interface of the distributed switch. The distributed switch within the processing control device of the radio units 125, 135, 145 supports bandwidth matching at the interface as determined by the data received at the interface. Data received at the distributed switch of a particular radio unit may then be processed by one of the plurality of resources within the processing control device of the radio unit. In this way, data may be transmitted from a first radio unit 125 to a second radio unit 135 and the unused resources of a second radio unit 135 may be used to perform processing and control management functions associated with the data originating from the first radio unit 125, thereby reducing routing bottlenecks in the communication system 100 and allowing easier scalability and modularity. The first radio unit 125 and the second radio unit 135 may be associated with the same sector or they may be associated with different sectors of the communication system. The embodiment shown with reference to FIG. 1A illustrates a communication network wherein the connection between the baseband unit and the one or more remote radio units is implemented in a chain or ring topology. In additional embodiments, illustrated with reference to FIG. 1B, the connection topology of the baseband unit and the one or more remote radio units may include point-to-point, multiple point-to-point, star, tree, or combinations thereof.

Figure 2A:
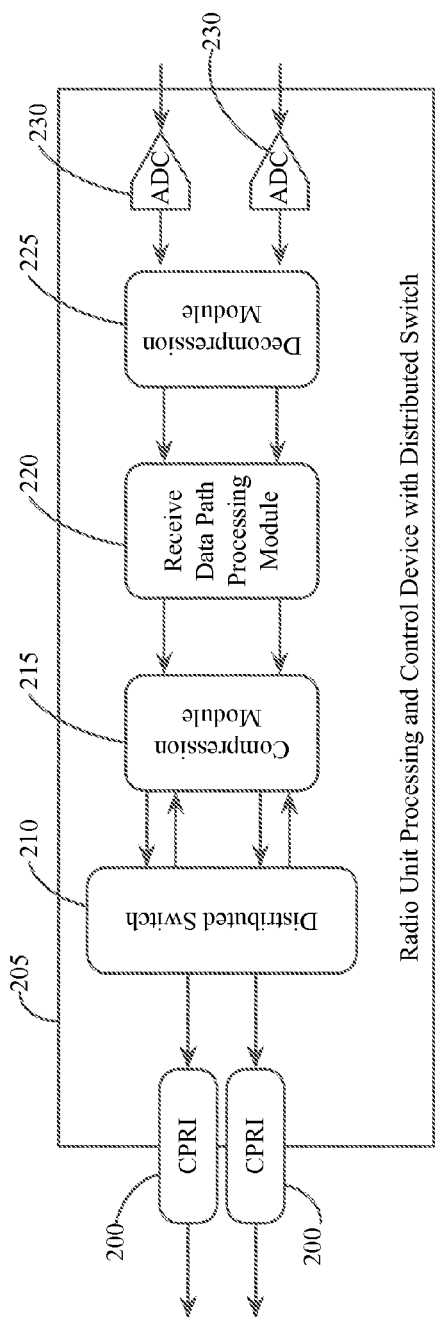
FIG. 2A is a block diagram illustrating a radio unit processing and control device having a distributed switch operating in an uplink mode having integrated converters in accordance with the present invention.
Figure 2B:
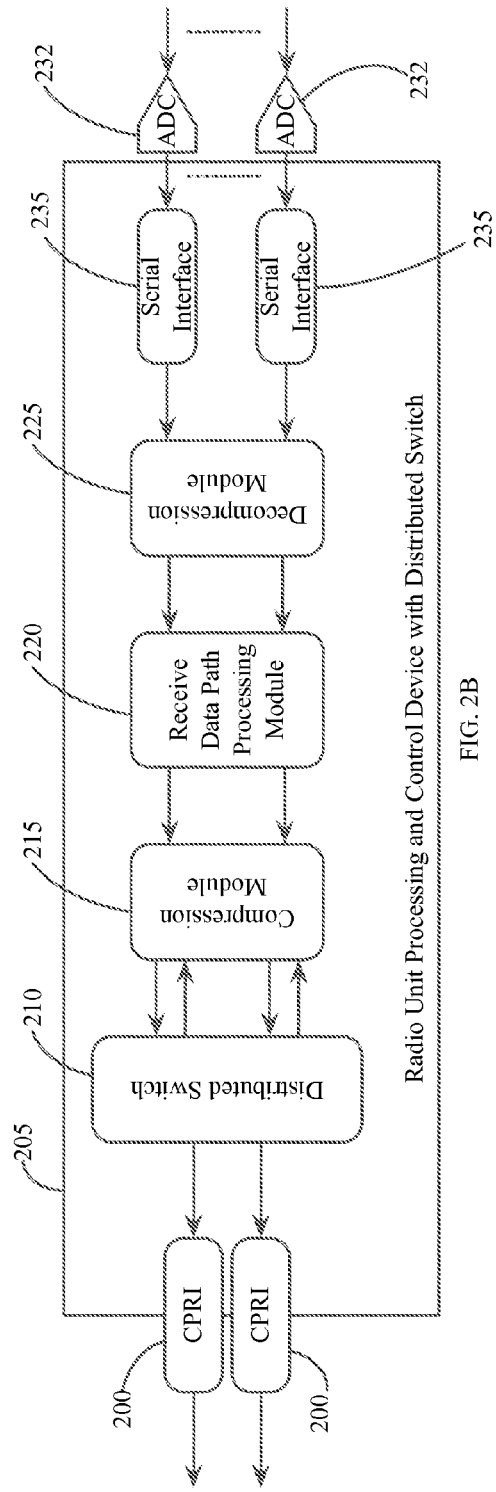
FIG. 2B is a block diagram illustrating a radio unit processing and control device having a distributed switch operating in an uplink mode having non-integrated converters in accordance with the present invention.

In a communication system operating in an uplink mode, radio frequency data is received from a user at an antenna associated with a remote radio unit to be transmitted to a baseband unit. The radio frequency data received at the remote radio unit is converted to digital data and additional data processing may be applied to the data at the radio unit. The data is then transmitted from the radio unit to the baseband unit for further processing. FIGS. 2A and 2B illustrate a radio unit processing and control device having a distributed switch 205 for receiving and processing data when the communication system is operating in an uplink mode.

With reference to FIG. 2A, a radio unit 205 in accordance with the present invention may include a radio unit processing and control device having a distributed switch 210. When the communication system is operating in an uplink mode, the radio unit processing and control device 205 may receive data from an antenna at one of a plurality of analog-to-digital converters 230 integrated within the radio unit processing and control device 205. The analog-to-digital converters 230 may receive the radio frequency data from the antenna and convert the radio frequency data to digital data. If the received data was compressed data, the digital data may be decompressed by the decompression module 225 prior to the transmission of the data to the receive data path processing module 220. After the decompressed data has been processed by the receive data path processing module 220, the data may be compressed by the compression module 215 prior to transmission through the distributed switch 210. By compressing the data prior to distribution through the distributed switch 210, the bandwidth requirement for the distributed switch 210 may be reduced. Additionally, compressing the data before distribution through the distributed switch 210 may reduce the power consumption of the device by reducing the required operating clock frequency of the distributed switch 210. Alternatively, the compression 215 may be bypassed and the data from the receive data path processing module 220 may be coupled directly to the distributed switch. In this embodiment, the distributed switch 210 may be operated at full-speed. After the data has been distributed through the distributed switch 210, the data may be communicated to the baseband unit through a CPRI link 200.

In the embodiment shown in FIG. 2A, the analog-to-digital converters 230 are integrated into the radio unit processing and control device 205. Integrating the analog-to-digital converters 230 into the radio unit processing and control device 205 reduces the number of discrete components and the number of high speed serial interfaces between the analog-to-digital converters 230 and the radio unit processing and control device 205, which may reduce the power requirements of the device and the overall cost of the radio unit. Alternatively, as shown with reference to FIG. 2B, the analog-to-digital converters 232 may be external to the radio unit processing and control device 205. When the analog-to-digital converters 232 are external to the radio unit processing and control device 205, a serial interface 235 (i.e., SERDES) may be implemented at the interface to the radio unit processing and control device 205 to communicate with the analog-to-digital converters 232. In a particular embodiment, the radio unit processing and control device may include integrated analog-to-digital converters 230, but the integrated analog-to-digital converters 230 may be bypassed and the non-integrated analog-to-digital converters 232 may be used. If the data received from the integrated analog-to-digital converters 230, or from the non-integrated analog-to-digital converters 232 if the integrated analog-to-digital converters 230 are bypassed, is compressed data, the digital data may be decompressed by the integrated decompression module 225 prior to transmission of the data to the receive data path processing module 220. After the decompressed data has been processed by the receive data path processing module 220, the data may be compressed by the compression module 215 prior to transmission through the distributed switch 210. By compressing the data prior to distribution through the distributed switch 210, the bandwidth requirement for the distributed switch 210 may be reduced. Additionally, compressing the data after distribution through the distributed switch 210 may reduce the power consumption of the device by reducing the required operating clock frequency of the distributed switch 210. Alternatively, the compression 215 may be bypassed and the data from the receive data path processing module 220 may be coupled directly to the distributed switch. In this embodiment, the distributed switch 210 may be operated at full-speed. After the data has been distributed through the distributed switch 210, the data may be communicated to the baseband unit through a CPRI link 200.

In a communication system operating in a downlink mode, data may be transmitted from the baseband unit to a remote radio unit for subsequent transfer of the data to a user via an antenna in communication with the remote radio unit. FIGS. 3A and 3B illustrate a radio unit processing and control device 305 having a distributed switch 310 for receiving and processing data when the communication system is operating in a downlink mode.

With reference to FIG. 3A, a radio unit in accordance with the present invention may include a radio unit processing and control device 305 having a distributed switch 310. When the communication unit is operating in a downlink mode, digital data may be received at a CPRI module 300 of the radio unit processing and control device 305 via a CPRI link between the baseband unit and the radio unit. The received data may then be distributed through the distributed switch 310 of the radio unit processing and control device 310. If the data transmitted via the CPRI link is compressed data, the distributed switch 310 of the present invention may distribute the data through the switch while maintaining the compression of the data. The data may then be decompressed by the decompression module 315 after the data has been distributed through the distributed switch 310. By compressing the data prior to distribution through the distributed switch 310, the bandwidth requirement for the distributed switch 310 may be reduced. Additionally, decompressing the data after distribution through the distributed switch 310 may reduce the power consumption of the device by reducing the required operating clock frequency of the distributed switch 310. After the data has been distributed through the distributed switch 310, the data may be communicated to the transmit data path processing module 320 for further processing. After the transmit data path processing module 320 has performed the required processing of the data, the data may be compressed by the compression module 325 prior to being transferred to the digital-to-analog converters 330. The digital-to-analog converters 330 may then convert the data to a radio frequency signal for transmission over the antenna. An optional feedback processing module 345 may be coupled to the transmit data path processing module 320. The feedback module 345 may be used to adjust the processing of the data by receiving the outgoing radio frequency signal through an analog-to-digital converter 335, decompressing the data at the decompression module 340 and communicating the feedback results to the transmit data path processing module 345.

In the embodiment shown in FIG. 3A, the digital-to-analog converters 330 are integrated into the radio unit processing and control device 305. Alternatively, as shown with reference to FIG. 3B, the digital-to-analog converters 332 may be external to the radio unit processing and control device 305. When the digital-to-analog converters 332 are not integrated into the radio unit processing and control device 305, a serial interface 350 may be implemented at the interface of the radio unit processing and the control device 305 to communicate with the digital-to-analog converters 332. In this embodiment, the data from the transmit data path processing module may be compressed by the integrated compression module 325 prior to being transmitted through the serial interface 350 and prior to being transmitted to the non-integrated digital-to-analog converters 332. Additionally, the feedback data from the analog-to-digital converters 337 may be decompressed by the internal decompression module 340 after being transmitted through the serial interface 350 and prior to being transferred to the feedback processing module 345.

As illustrated with reference to FIGS. 2A and 2B, in the uplink mode, the radio unit processing and control device and distributed switch 205 of the present invention provides compression of the data prior to the data being distributed through the distributed switch 210. Additionally, as illustrated in FIGS. 3A and 3B, in the downlink mode, the radio unit processing and control device and distributed switch 305 of the present invention provides decompression of the data after the data has been distributed through the distributed switch 310. As such, in both the uplink mode and the downlink mode, compressed data is distributed through the distributed switch which reduces the bandwidth requirement of the switch and reduces power consumption of the switch by reducing the operating clock frequency. While the exemplary embodiments for the uplink mode and the downlink mode have been illustrated with reference to separate figures, it is not necessary that uplink and downlink of the radio unit be implemented separately. It is commonly known in the art to have both the transmit processing (downlink) and the receive processing (uplink) for the radio card implemented in a common transceiver unit.

With the distributed switch of the present invention, data from various interfaces, or nodes, of the radio unit processing and control device can be merged with CPRI bridging data from a radio unit operating in another sector. Additionally, the distributed switch of the present invention allows transmission data to be divided between different interfaces, such as between a wired (e.g., CPRI) and wireless (e.g., Ethernet) protocols.

Figure 4:
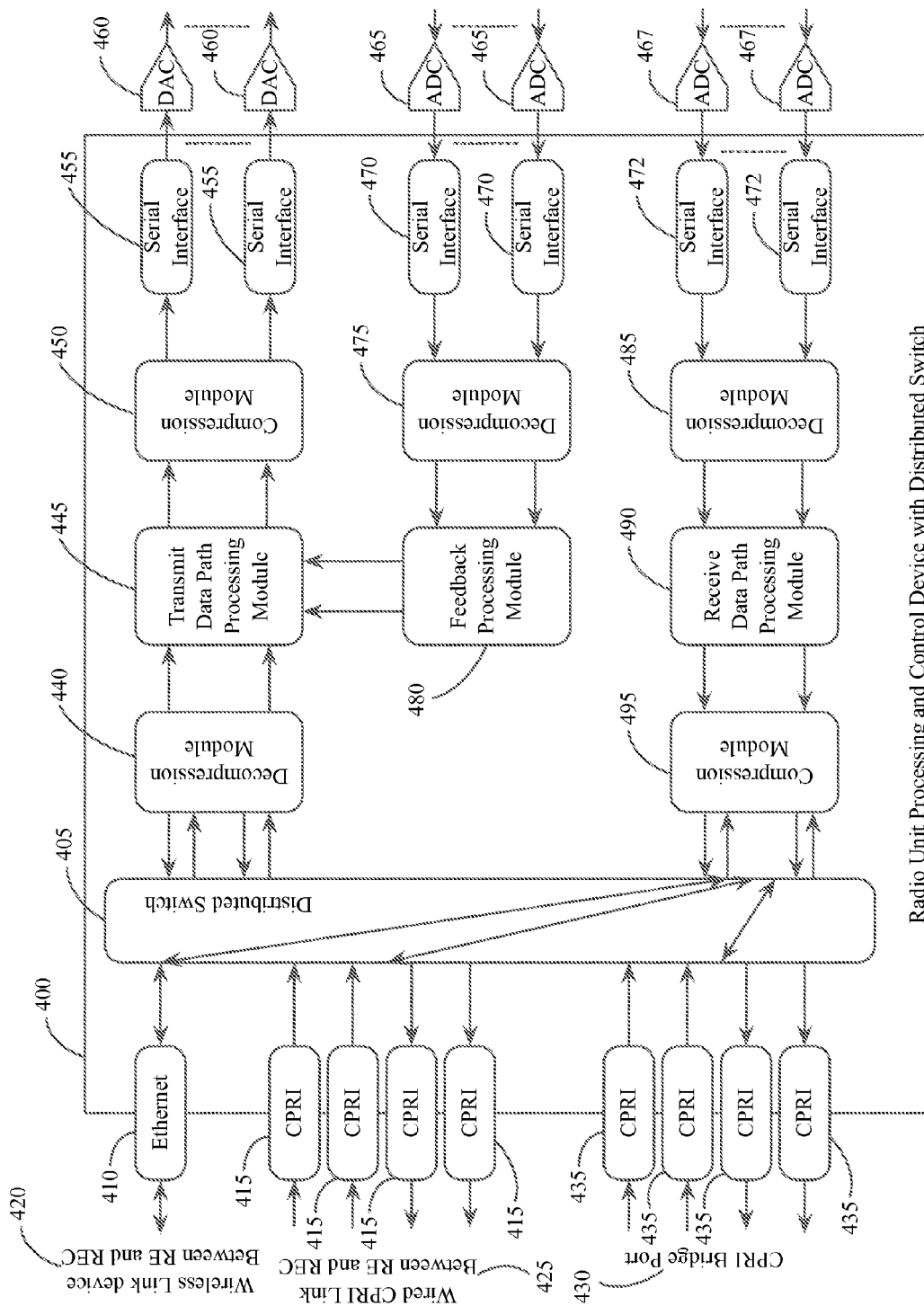
FIG. 4 is a block diagram illustrating a radio unit processing and control device having a distributed switch operating providing merging and splitting of data in accordance with the present invention.

With reference to FIG. 4, the distributed switch 405 of the radio unit processing and control device 400 of the present invention provides for merging and division and of data through the distributed switch. FIG. 4 illustrates the radio unit 400 incorporating the processing resources for the uplink, downlink and feedback modes of data transmission. In this embodiment, data 425 may be received at the radio unit 400 from a baseband unit or transferred from the radio unit 400 to a baseband unit via a wired CPRI link interface 415 of the radio unit 400. Additionally, data 420 may be received at the radio unit 400 from a baseband unit or transferred from the radio unit 400 to a baseband unit via a wireless link interface 410 (i.e., Ethernet) of the radio unit 400. The radio unit 400 may also receive data 430 from a second radio device or transfer data to another radio device via a CPRI bridge port interface 435. The second radio device may be operating in the same sector or in a different sector. In this embodiment, the incoming data 420, 425, 430 is received at each of the identified interfaces and subsequently transferred to the distributed switch. The data received at each of the interfaces of the radio unit 400 may be related to one of various protocols known in the art and, as such, may be associated with one of a plurality of bandwidths. In the present invention, the distributed switch 405 may be configured to match the various protocols and associated bandwidths of the data at the switch interface.

After the data has been received at the distributed switch 405, the data may be distributed through the switch to one of a plurality of resources of the radio unit processing and control device 400. In a particular embodiment, the resources of the radio unit processing and control device 400 may include one or more decompression modules 440, 475, 485. Alternatively, these individual decompression modules 440, 475, 485 may be implemented as a single shared decompression module. The resources may further include one or more compression modules 450, 495. Again, these individual compression modules 450, 495 may be implemented as a single shared compression module. Additional resources of the radio unit processing and control device 400 may include a transmit data path processing module 445, a feedback processing module 480, a receive data path processing module 490 and a plurality of serial interfaces 455, 470, 472. In the illustrated embodiment, the digital-to-analog converters 460 and the analog-to-digital converters 465, 467 are not integrated into the radio unit processing and control device 400, however, as previously discussed, in an alternate embodiment the digital-to-analog converters 460 and the analog-to-digital converters 465, 467 may also be integrated into the radio unit processing and control device 400.

In operation, data may be received at one of the interfaces of the distributed switch 405 and distributed to one of the plurality of resources of the radio unit processing and control device 400 via the distributed switch 405. In a particular embodiment, second radio unit operating in the same sector or in a different sector of the communication system may be overburdened due to an overload of data requiring processing. Such an overload may occur in various locations in the communication system depending upon the number of users at a particular time of day. If the radio unit is too busy to be able to process the data in a reasonable amount of time, the user experience may decline. In the present invention, assuming the radio unit processing and control device 400 is not overburdened and as such, has available resources, the overburdened second radio unit may transfer data to the CPRI bridge port 435 of the radio unit processing and control device 400 of the present invention and the distributed switch 405 of the present invention may distribute the data to one of the available resources in the radio unit processing and control device 400 for further processing. The radio unit processing and control device 400 may then transfer the processed data back to the overburdened radio unit over the CPRI Bridge port 435. In this way, the distributed switch 405 may reduce routing bottlenecks and allow improved scalability and modularity.

In an additional embodiment of the present invention, for the purposes of calibration or debugging of the communication system, debug or calibration data received at an antenna coupled to one of the analog-to-digital converters 467 of the radio unit processing and control device 400 or data received from another radio unit may be merged with CPRI data to be transmitted to the baseband unit via the CPRI interface 415 or via the CPRI Bridge port interface 435.

The distributed switch 405 of the present invention also allows data traffic partitioning wherein data received at an antenna coupled to one of the analog-to-digital converters 467 may be divided, or split, between one or more of the interfaces 410, 415, 435 of the distributed switch 405. In a particular embodiment, data received at the analog-to-digital converter 467 for transmission to a baseband unit may be decompressed by the decompression module 490, processed by the receive data path processing data path processing module 490 and then compressed by the compression module 495 prior to entering the distributed switch 405. The distributed switch 405 may then partition the data by transmitting one portion of the data to the baseband unit via the wireless Ethernet link 410 and transmitting another portion of the data to the baseband unit via the wired CPRI link 415. As such, the distributed switch 405 of the present invention provides for data traffic partitioning, thereby improving the efficiency of the radio unit.

Figure 5:
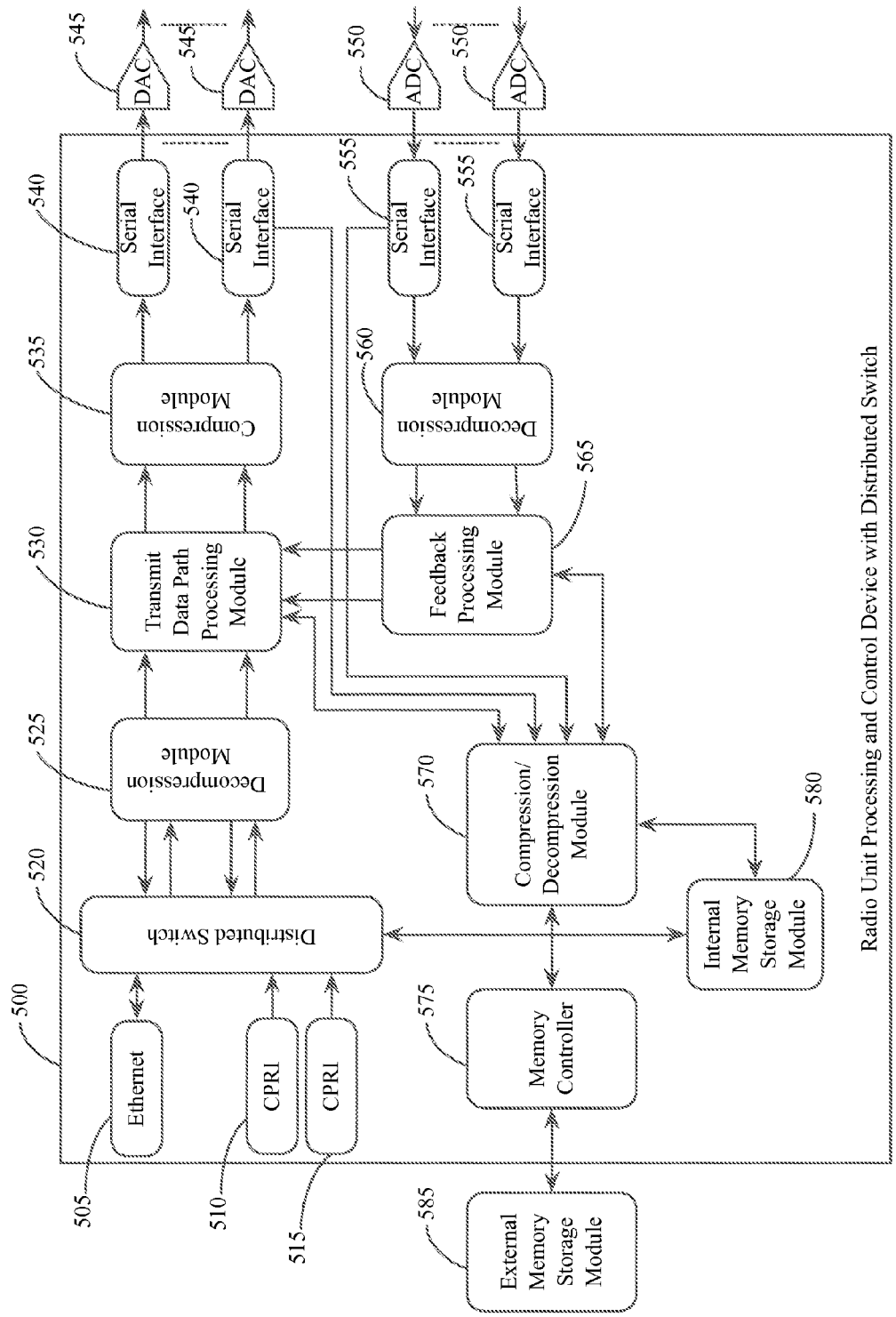
FIG. 5 is a block diagram illustrating a radio unit processing and control device having a distributed switch employing memory storage compression in accordance with the present invention.

With reference to FIG. 5, the distributed switch 520 of the radio unit processing and control unit of the present invention 500 also provides for improved memory storage at the radio unit. In the present invention, external memory 585 and internal memory 580 are accessible from various interfaces via the distributed switch 520. Additionally, compression and decompression modules 570 are accessible from the various interfaces and coupled to the external memory 585 and internal memory 580 to reduce the storage requirements of the system by compressing the data prior to storing the data in the memory modules 585, 580. In a particular embodiment, data may be received at the Ethernet interface 505 or the CPRI interface 510 and the received data may be transmitted to the distributed switch 520. If the received data is CPRI data that was compressed prior to transmission to the radio unit, the compressed CPRI data may be transmitted directly to an internal memory storage module 580 via the distributed switch 520. If the received data is CPRI data or wireless Ethernet data that is to be transmitted to a user, the received data may be decompressed at the decompression module 525 after it has been distributed through the switch 520. The decompressed data may then be transmitted to the transmit data path processing module 530 for further signal processing and then compressed at the compression module 535 prior to being transmitted to the digital-to-analog converters 545 converters via the serial interface 540. If the data is also to be stored at the radio unit processing and control device 500, the data may additionally be transmitted from the serial interface 540 to the internal memory storage module 580 or to the memory controller 575 via the compression/decompression module 570. Data received at the memory controller 575 may subsequently be transferred to the external memory storage module 585 associated with the radio unit. Additionally, CPRI data may be received from a second radio unit operating in another sector to be stored on a memory module associated with the radio unit. In this situation, the CPRI data may be received an a CPRI bridge port, compressed at the compression/decompression module 570 and stored on either the internal memory storage module 580 or the external memory storage module 585 via the memory controller 575. In an additional embodiment the received data may already be compressed and as such, the compression/decompression module 570 may be bypassed. In an additional embodiment, in a feedback mode, data received at the radio unit processing and control device 500 from one of the analog-to-digital converters 550 via the serial interface 555 may be transmitted from the serial interface 555 to the compression/decompression module 570 and compressed prior to being stored on either the internal memory storage module 580 or the external memory storage module 585 via the memory controller 575. The data may also be processed through the decompression module 560 and the feedback processing module 565 prior to being compressed at the compression/decompression module 570 and stored in the internal memory storage module 580 or the external memory storage module 585. In the present invention, the compression/decompression module 570 is coupled to the distributed switch 520 which allows data received at the switch to be compressed at the compression/decompression module 570 prior to being stored on the internal memory storage module 580 or the external memory storage module 585. Compressing the data prior to being stored at one of the memory modules reduces the bandwidth requirements of the memory interface, thereby reducing the memory foot-print related to the memory storage of the radio unit.

With the present invention, the distributed switch 520 provides for both internal (i.e., on-chip) and external (i.e., off-chip) memory storage from various nodes and/or interfaces of the radio unit processing and control device 500. Additionally, the distributed switch 520 in combination with the compression/decompression module reduces the storage requirements of the system by enabling the memory storage of compressed data from various nodes and/or interfaces. In an exemplary embodiment, the data stored in memory may be accessed during mission mode in combination with CPRI data merging through the distributed switch. Thus, it is possible to send debug data in mission mode (e.g., in real time) from any sector to any other sector's radio device or to the baseband modules for remote monitoring. In an additional embodiment, the data stored in memory may be accessed at a future time for remote monitoring and control functions.

The present invention provides for on-chip distributed switching which allows bandwidth matching of a variety of different interfaces and resources. In the present invention the resources of the remote radio unit are considered to be internal to the remote radio unit. While the resources may be considered on-chip or off-chip, they are considered internal resources as they are included within the radio unit. As shown with reference to FIG. 6, the transmit data path processing module 608, feedback processing module 616, I/O protocol and SERDES 614, receive data path processing module 618, compression and decompression module 622, memory 624 and data converter 626 may all be described as internal resources of the radio unit.

Figure 6:
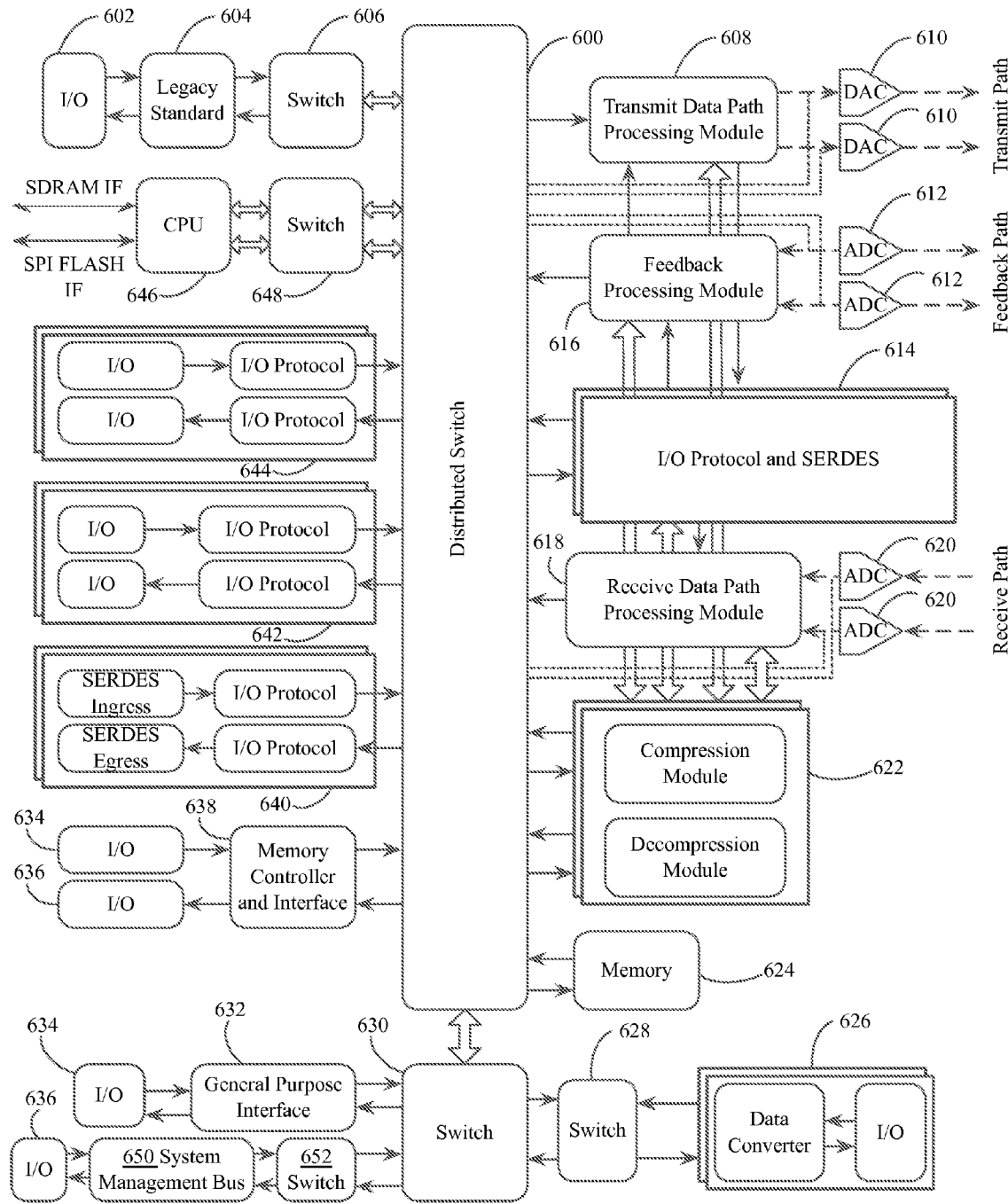
FIG. 6 is a block diagram illustrating a radio unit processing and control device having a distributed switch employing a plurality of switch interfaces and resources in accordance with the present invention.

With reference to FIG. 6, a radio unit processing and control device having a distributed switch is illustrated in more detail. As illustrated in FIG. 6, the distributed switch of the present invention may comprise multiple switches operating at various bandwidths and associated protocols. In a particular embodiment the distributed switch 600 may include a switch 606 operating at a bandwidth associated with a legacy standard 604 to transmit data to, or receive data from, an I/O port 602 of the radio unit processing and control device. The distributed switch may additionally include switch 648 to transmit data to, or receive data from, a CPU 646 having an associated bandwidth which may be different than the legacy standard 604. The distributed switch 600 may be configured to transmit data to, or receive data from, I/O ports associated with a wireless Ethernet protocol. In a particular embodiment, the Ethernet I/O may be associated with an Ethernet wireless bridging protocol 644 or in an additional embodiment, the Ethernet I/O may be associated with a debug or chaining protocol 647. The distributed switch 600 may further be configured to receive data from a baseband unit or another radio unit operating in another section via the CPRI interface 640. The distributed switch 600 may further be configured to receive data from I/O ports 634, 636 associated with a memory controller and interface 638 that may be associated with an off-chip memory module. The distributed switch 600 may further include switch 630 to communicate with an I/O 634 associated with a general purpose interface 632. Switch 652 may additionally communicate with an I/O 636 associated with a system management bus through switch 630. Analog-to-digital/digital-to-analog converter 626 may communicate with the distributed switch 600 through switch 628 and 630. The distributed switching of the present invention allows for matching of the switch interface to an associated bandwidth and protocol for any of the I/O interfaces of the radio unit and provides for distribution of data from any of the interfaces to any of the system resources of the radio unit for further processing and storage.

In operation, the distributed switch may be operated in a transmission, or downlink, mode wherein data is received at one of the various interfaces, including, but not limited to, the legacy standard interface 604, CPU interface 646, Ethernet interface 644, 647, CPRI interface 640 or the memory controller interface 638. Upon receiving data at one of the various interfaces, the distributed switch 600 may be configured to match the data bandwidth of the data and to distribute the received data directly to one of the plurality of resources of the radio unit. The resources of the radio unit may include a transmit data path processing module 608, a feedback processing module 616, a serial interface 614, a receive data path processing module 618, a compression/decompression module 622 or an on-chip memory module 624. The transmit data path processing module 608 may further be coupled to a plurality of digital-to-analog converters 610 to prepare the radio signal for transmission to the user. The feedback processing module 616 may further be coupled to a plurality of analog-to-digital converters 612 for receiving an analog feedback signal from the antenna for further processing. The receive data path processing module 618 may further be coupled to a plurality of analog-to-digital converters 620 for receiving the radio frequency signal from the antennas. As is illustrated, the digital-to-analog converters 610 and the analog-to-digital converters 612 and 620 can be accessed from the distributed switch 600. As such, in the present invention it is possible to access signals from the integrated data converters and from the data converter interface for non-integrated converters (not shown) directly through the distributed switch 600. As is shown in FIG. 6, the transmit data path processing module 608, feedback processing module 616, serial interface 614 and receive data path processing module 618 are coupled to the compression/decompression module 622, thereby allowing for compression of the data prior to transfer over the distributed switch 600 and decompression of the data after transfer over the distributed switch 600.

Figure 7:
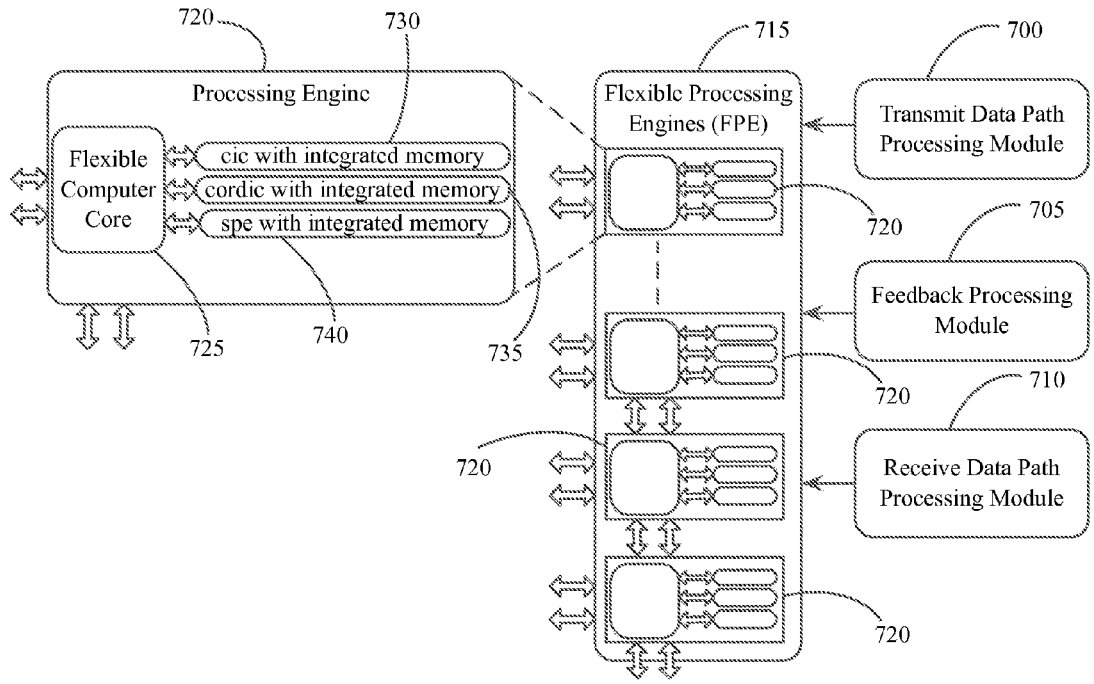
FIG. 7 is a block diagram illustrating the flexible processing engines having integrated configurable processors and coefficient memory in accordance with the present invention.

The radio unit processing and control device may additionally include high performance, low power flexible processing engines that may be enabled based on the processing needs of the radio unit. As shown with reference to FIG. 7, a flexible processing engine unit 715, comprising a plurality of flexible processing engines 720, may be coupled to the transmit data path processing module 700, the feedback processing module 705 or the receive data path processing module 710 of the radio unit processing and control unit. The hardware accelerators of the flexible processing engines 720 may be a Signal Processing Engines (SPE) 740, Coordinate Rotation Digital Computers (CORDIC) 735 or CIC processing engines 740. The hardware accelerators may be enabled or disabled as necessary by the radio unit processing and control unit. The SPEs may further include local coefficient RAM to significantly increase throughput of the device. In the present invention, the flexible processing engines 720 may further include an integrated flexible computer core 725 in communication with the CORDIC 735, SPE 740 and CIC 730 processing engines. The integrated flexible computer core 725 may be easily configured, debugged and rapidly programmed using high-level language. The integrated flexible computer core 725 provides a low power, high performance solution. The integration of the flexible computer core 725 may reduce the power consumption and required chip area of the radio unit. The engines provide ASIC-like performance and power consumption while providing full flexibility to support wide bandwidth signals from large number of antennas.

Figure 8:
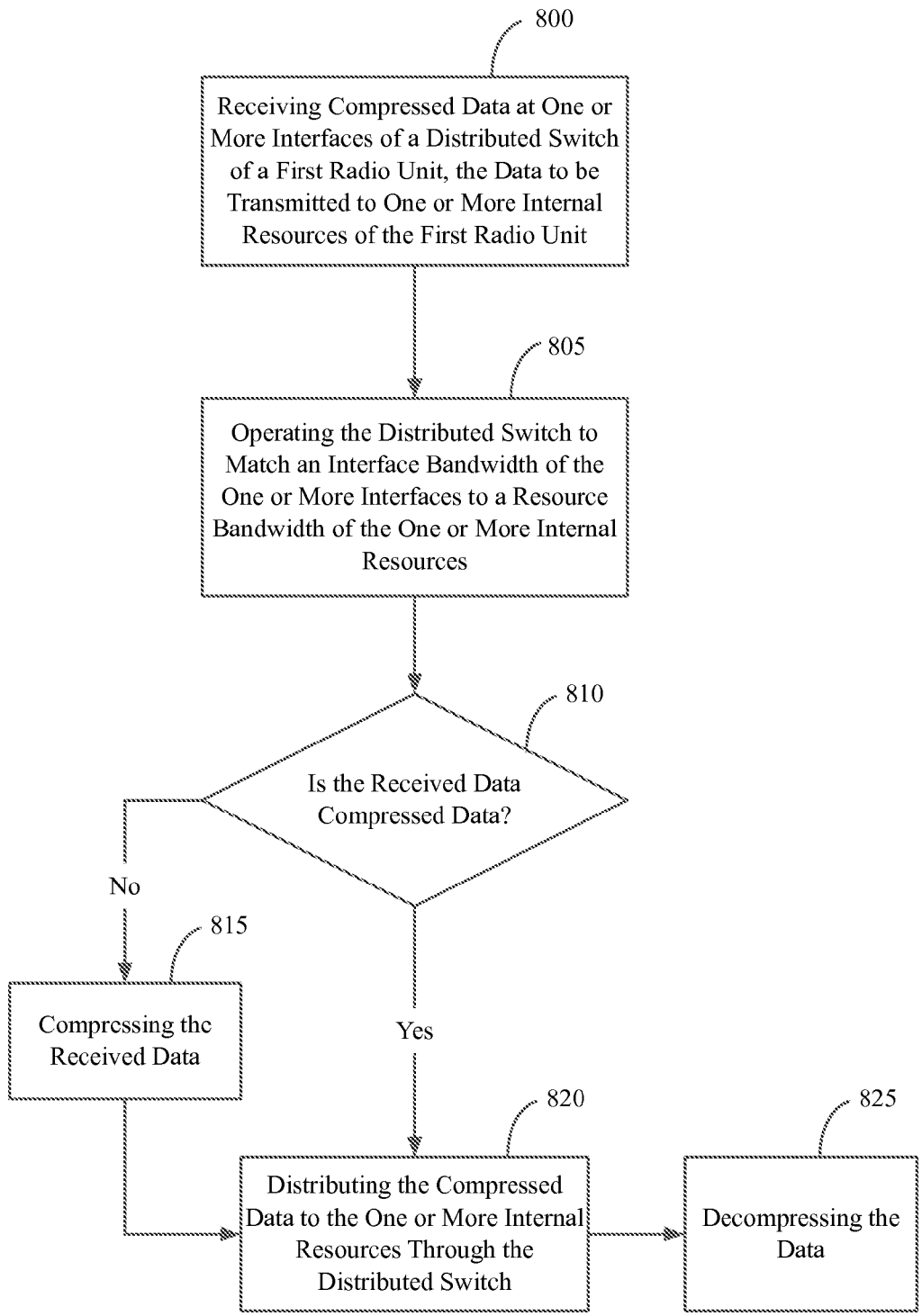
FIG. 8 is a flow diagram illustrating an embodiment of the present invention operating in an uplink mode.

With reference to FIG. 8, in an embodiment of the present invention operating in an uplink mode, the method may include receiving compressed data at one or more interfaces of a distributed switch of a first radio unit, wherein the received data is to be transmitted from the switch to one or more internal resources of the first radio unit 800. The method may further include operating the distributed switch to match an interface bandwidth of the one or more interfaces of the switch to a resource bandwidth of the one or more internal resources 805. By matching the interface bandwidth of the switch to the resource bandwidth it is possible to optimize the bandwidth of the switch interface which will allow the switch interface to run at a different clock frequency. If the received data is not compressed data 810, the data may be compressed 815 prior to distributing the compressed data to the one or more resources 820, thereby reducing the required speed and associated power consumption of the switch. The data may then be decompressed 825 after the compressed data has been distributed to the one or more resources.

With reference to FIG. 6, in one embodiment of the present invention operating in an uplink mode, the method of the present invention may include receiving compressed data at one or more interfaces, including, but not limited to, a legacy standard interface 604, CPU interface 646, Ethernet interface 644, 647, CPRI interface 640 or the memory controller interface 638. Upon receiving data at one of the various interfaces, the distributed switch 600 may be configured to match the data bandwidth of the data and to distribute the received data directly to one of the plurality of resources of the radio unit. The resources of the radio unit may include a transmit data path processing module 608, a feedback processing module 616, a serial interface 614, a receive data path processing module 618, a compression/decompression module 622 or an on-chip memory module 624. As is shown in FIG. 6, the transmit data path processing module 608, feedback processing module 616, serial interface 614 and receive data path processing module 618 are coupled to the compression/decompression module 622, thereby allowing for compression of the data prior to transfer over the distributed switch 600 and decompression of the data after transfer over the distributed switch 600.

In one embodiment, some or all of the data coupled between the baseband unit 105 and the remote radio units 125, 135, 145, may be compressed data. In one embodiment, the compressed data includes compressed signal data that may be compressed and formatted in a manner disclosed in U.S. Pat. No. 8,005,152, entitled, "Compression of Baseband Signals in Base Transceiver Systems", or in U.S. patent application Ser. No. 13/476,862, filed on May 21, 2012, entitled, "OFDM Signal Processing in a Base Transceiver System", both of which are hereby incorporated by reference in their entirety. In these embodiments, compressed signal data that is received at a remote radio unit 125, 135, 145 (e.g., from baseband unit 105) may be distributed in its compressed form within the remote radio unit 125, 135, 145 as indicated by step 820 prior to being outputted to an antenna 155, 160, 165, 170, 175, 180.

Figure 9:
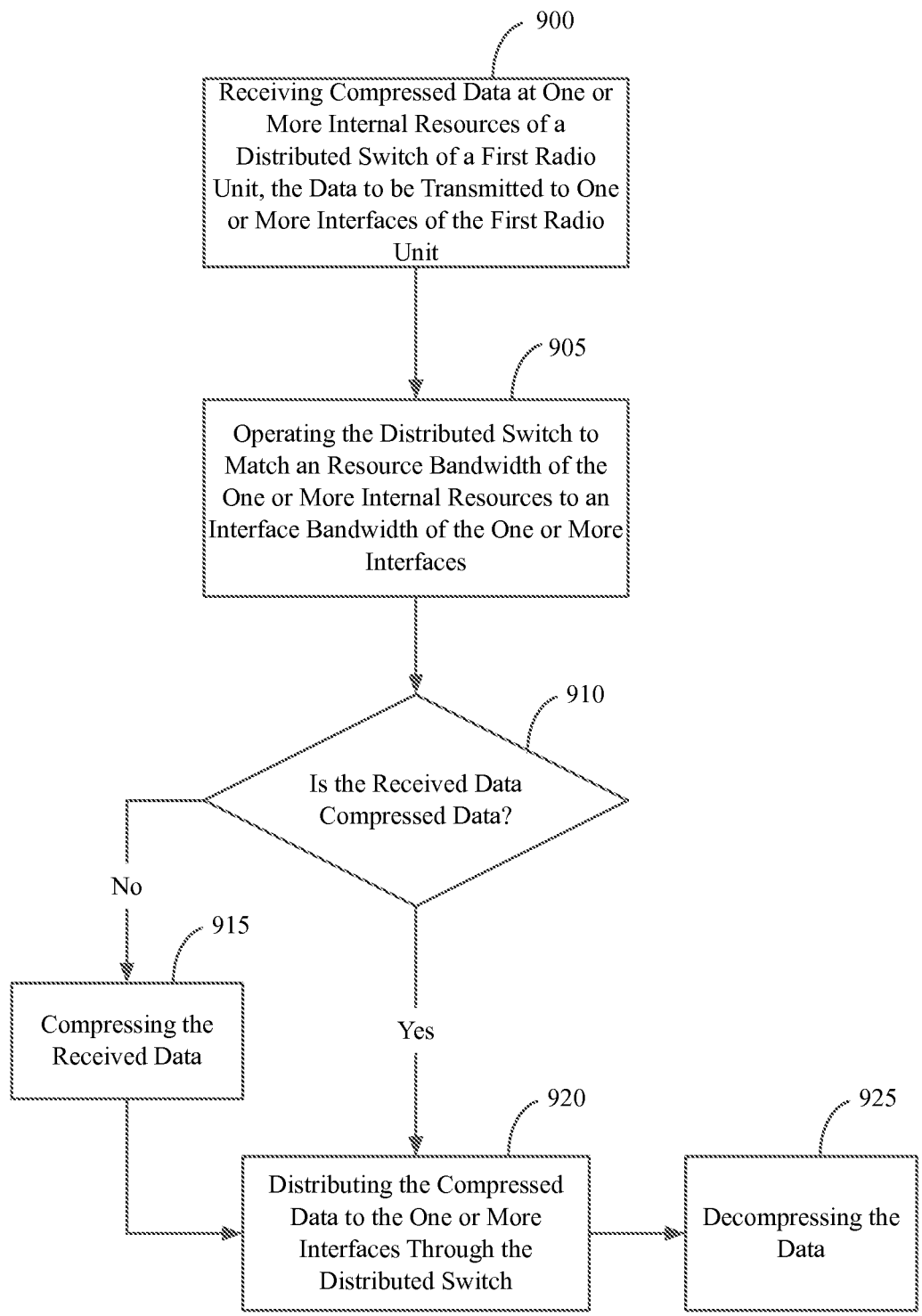
FIG. 9 is a flow diagram illustrating an embodiment of the present invention operating in a downlink mode.

With reference to FIG. 9, in an embodiment of the present invention operating in a downlink mode, the method may include receiving compressed data at one or more internal resources of a distributed switch of a first radio unit, wherein the received data is to be transmitted to one or more interfaces of the first radio unit 900. The method may further include operating the distributed switch to match a resource bandwidth of the one or more internal resources to an interface bandwidth of the one or more interfaces of the switch 905. By matching the interface bandwidth of the switch to the resource bandwidth it is possible to optimize the bandwidth of the switch interface which will allow the switch interface to run at a different clock frequency. If the received data is not compressed data 910, the data may first be compressed 915 prior to distributing the compressed data to the one or more interfaces 920, thereby reducing the required speed and associated power consumption of the switch. The data may then be decompressed 925 after the compressed data has been distributed to the one or more resources.

With reference to FIG. 6, in one embodiment of the present invention operating in a downlink mode, the method of the present invention may include receiving compressed data at one or more resources of the radio unit. The resources of the radio unit may include a transmit data path processing module 608, a feedback processing module 616, a serial interface 614, a receive data path processing module 618, a compression/decompression module 622 or an on-chip memory module 624. Upon receiving data at one of the various interfaces, the distributed switch 600 may be configured to match the data bandwidth of the data and to distribute the received data directly to one of the plurality of interfaces of the distributed switch 600. The plurality of interfaces including, but not limited to, a legacy standard interface 604, CPU interface 646, Ethernet interface 644, 647, CPRI interface 640 or the memory controller interface 638. As is shown in FIG. 6, the transmit data path processing module 608, feedback processing module 616, serial interface 614 and receive data path processing module 618 are coupled to the compression/decompression module 622, thereby allowing for compression of the data prior to transfer over the distributed switch 600 and decompression of the data after transfer over the distributed switch 600.

The radio unit processing and control module and distributed switch of the present invention supports load balancing and CoMP for wide bandwidth signals employing a large number of antennas. In addition, the radio unit processing and control module and distributed switch of the present invention reduces infrastructure cost (baseband and radio) by reducing fiber links. The method and apparatus of the present invention allows interconnect devices to effectively process higher bandwidth signals even with lower port rates (e.g., support 80 G with 40 G port using 2:1 compression).

Though the radio unit processing and control module and distributed switch of the present invention is designed for use with next generation architecture that includes load-balancing and pooled baseband, in other embodiments, the radio unit processing and control module and distributed switch is adapted to be used in existing network architectures that do not include load balancing or pooled baseband.

As is known in the art, the radio unit processing and control module and distributed switch architecture may be implemented in a Field Programmable Gate Array (FPGA), an Application-Specific Integrated Circuit (ASIC) or a variety of other commonly known integrated circuit devices. The implementation of the invention may include both hardware and software components.

The invention claimed is:

1. A method for processing data in a radio unit of a communication system, the method comprising:

receiving data at one or more interfaces of a distributed switch of the radio unit, the received data to be transmitted to one or more internal resources of the radio unit, wherein each of the interfaces has an associated interface bandwidth and an associated operating frequency and each of the internal resources has an associated resource bandwidth;

operating the one or more interfaces of the distributed switch at the operating frequency associated with the one or more interfaces of the distributed switch if the received data is decompressed data and operating the one or more interfaces of the distributed switch at a reduced operating frequency if the received data is compressed data;

operating the one or more interfaces of the distributed switch to match the interface bandwidth of the one or more interfaces to the resource bandwidth of the one or more internal resources; and distributing the received data at the one or more interfaces to the one or more internal resources of the radio unit through the distributed switch at the operating frequency if the received data is decompressed data and distributing the received data at the one or more interfaces to the one or more internal resources of the radio unit through the distributed switch at the reduced operating frequency if the received data is compressed data, wherein the distributing the data received at the one or more internal resources to the one or more internal interfaces of the radio unit through the distributed switch further comprises distributing at least some of the received data to an on-chip memory storage module or an off-chip memory storage module.

2. The method of claim 1, further comprising, if the received data is decompressed data, compressing the received data prior to distributing the received data at the one or more interfaces to the one or more internal resources of the first radio unit through the distributed switch.

3. The method of claim 1, further comprising, if the received data is compressed data, decompressing the received data after distributing the received data at the one or more interfaces to the one or more internal resources of the radio unit through the distributed switch.

4. The method of claim 1, wherein the radio unit is operating in a first sector or cell and the received data is data from another radio unit operating in a second sector or cell.

5. The method of claim 1, wherein the received data is received at more than one interface, the method further comprising, merging the received data at the more than one interface prior to distributing the received data to the one or more internal resources.

6. A method for processing data in a radio unit of a communication system, the method comprising:
receiving data at one or more internal resources of a distributed switch of the radio unit, the received data to be transmitted to one or more interfaces of the radio unit, wherein each of the internal resources has an associated resource bandwidth and each of the interfaces has an associated interface bandwidth and as associated operating frequency;
operating the one or more interfaces of the distributed switch at the operating frequency associated with the one or more interfaces of the distributed switch if the received data is decompressed data and operating the one more interfaces of the distributed switch at a reduced operating frequency if the received data is compressed data;
operating the one or more interfaces of the distributed switch to match the resource bandwidth of the one or more internal resources to the interface bandwidth of the one or more interfaces; and
distributing the data received at the one or more internal resources to the one or more interfaces of the radio unit through the distributed switch at the operating frequency if the received data is decompressed data and distributing the received data at the one or more internal resources to the one or more interfaces of the radio unit through the distributed switch at the reduced operating frequency if the received data is compressed data, wherein the distributing the data received at the one or more internal resources to the one or more internal interfaces of the radio unit through the distributed switch further comprises distributing at least some of the received data to an on-chip memory storage module or an off-chip memory storage module.

7. The method of claim 6, further comprising, if the received data is decompressed data, compressing the received decompressed data prior to distributing the received data at the one or more internal resources to the one or more interfaces of the radio unit through the distributed switch.

8. The method of claim 6, further comprising, if the received data is compressed data, decompressing the received compressed data after distributing the received data at the one or more internal resource to the one or more interfaces of the radio unit through the distributed switch.

9. The method of claim 7, wherein the radio unit is operating in a first sector or cell and the received data is distributed to an interface associated with another radio unit operating in a second sector or cell.

10. The method of claim 6, wherein the one or more interfaces is selected from the group comprising, a wireless interface, a wired interface or a wireless interface in combination and a wired interface.

11. The method of claim 6, further comprising partitioning the received data and distributing a first portion of the partitioned data to a first one of the interfaces and distributing a second portion of the partitioned data to a second one of the interfaces.

12. An apparatus for processing data in a radio unit of a communication system, the apparatus comprising:
a radio unit processing and control unit having a distributed switch, the distributed switch further configured to:
receive data at one or more interfaces of the distributed switch, the received data to be transmitted to one or more internal resources of the radio unit, wherein each of the interfaces has an associated interface bandwidth and an associated operating frequency and each of the internal resources has an associated resource bandwidth;
operate the one or more interfaces of the distributed switch at the operating frequency associated with the one or more interfaces of the distributed switch if the received data is decompressed data and operating the one or more interfaces of the distributed switch at a reduced operating frequency if the received data is compressed data;
operate the one or more interfaces to match the interface bandwidth of the one or more interfaces to the resource bandwidth of the one or more internal resources; and
distribute the received data at the one or more interfaces to the one or more internal resources of the radio unit through the distributed switch at the operating frequency if the received data is decompressed data and distributing the receive data at the one or more interfaces to the one or more internal resources of the radio unit through the distributed switch at the reduced operating frequency if the received data is compressed data, wherein the one or more internal resources includes a memory storage module selected from the group consisting of an on-chip memory storage module and an off-chip memory storage module, the distributed switch configured to distribute at least some of the received data to the memory storage module.

13. The apparatus of claim 12, wherein the distributed switch is further configured to receive decompressed data, the apparatus further comprising a compression module coupled to the distributed switch, the compression module to compress the received decompressed data prior to the switch distributing the received data received at the one or more interfaces to the one or more internal resources of the radio unit.

14. The apparatus of claim 12, further comprising a decompression module coupled to the distributed switch, the decompression module to decompress the received compressed data after the switch has distributed the compressed received data at the one or more interfaces to the one or more internal resources of the radio unit.

15. The apparatus of claim 12, wherein the received data is data from another radio unit operating in a different sector or cell.

16. The apparatus of claim 12, further comprising:
at least one data converter; and
at least one flexible processing engine comprising a flexible computer core integrated into the radio unit processing and control unit, the flexible computer core having an integrated memory.

17. The apparatus of claim 12, wherein the distributed switch is further configured to receive data at more than one interface and to merge the data received at the more than one interface prior to distributing the received data to the one or more internal resources.

18. An apparatus for processing data in a radio unit of a communication system, the apparatus comprising:
a radio unit processing and control unit having a distributed switch, the distributed switch further configured to:
receive data at one or more internal resources of the radio unit, the received data to be transmitted to one or more interfaces of the radio unit, wherein each of the internal resources has an associated resource bandwidth and each of the interfaces has an associated interface bandwidth and an associated operating frequency;
operate the one or more interfaces of the distributed switch at the operating frequency associated with the one or more interfaces of the distributed switch if the received data is decompressed data and operating the one or more interfaces of the distributed switch at a reduced operating frequency if the received data is compressed data;
operate the one or more interfaces to match the resource bandwidth of the one or more internal resources to the interface bandwidth of the one or more interfaces; and
distribute the data received at the one or more internal resources to the one or more interfaces of the radio unit through the distributed switch at the operating frequency if the received data is decompressed data and distribute the receive data at the one or more internal resources to the one or more interfaces of the radio unit through the distributed switch at the reduced operating frequency if the received data is compressed data, wherein the one or more internal resources includes a memory storage module selected from the group consisting of an on-chip memory storage module and an off-chip memory storage module, the distributed switch configured to distribute at least some of the data received at the one or more internal resources from the memory storage module to the one or more interfaces of the radio unit.

19. The apparatus of claim 18, wherein the distributed switch is further configured to receive decompressed data, the apparatus further comprising a compression module coupled to the distributed switch, the compression module to compress the received decompressed data prior to the switch distributing the received data at the one or more internal resources to the one or more interfaces of the radio unit.

20. The apparatus of claim 18, further comprising a decompression module coupled to the distributed switch, the decompression module to decompress the received compressed data after distributing the received data at the one or more internal resources to the one or more interfaces of the radio unit through the distributed switch.

21. The apparatus of claim 18, wherein the received data is data from another radio unit operating in a different sector or cell.

22. The apparatus of claim 18, wherein the one or more interfaces is selected from the group comprising, a wireless interface, a wired interface or a wireless interface in combination with a wired interface.

23. The apparatus of claim 18, further comprising:
at least one data converter: and
at least one flexible processing engine comprising a flexible computer core integrated into the radio unit processing and control unit, the flexible computer core having an integrated memory.

24. The apparatus of claim 18, wherein the distributed switch is further configured to receive data at more than one internal resource and to merge the received data at the more than one internal resource prior to distributing the received data to the one or more interfaces.

* * * * *